United States Patent [19]
Klein

[11] Patent Number: 5,935,258
[45] Date of Patent: Aug. 10, 1999

[54] APPARATUS FOR ALLOWING DATA TRANSFERS WITH A MEMORY HAVING DEFECTIVE STORAGE LOCATIONS

[75] Inventor: Dean A. Klein, Eagle, Id.

[73] Assignee: Micron Electronics, Inc., Nampa, Id.

[21] Appl. No.: 08/811,563

[22] Filed: Mar. 4, 1997

[51] Int. Cl.[6] .................................................. G06F 11/00
[52] U.S. Cl. ..................... 714/8; 714/7; 714/54; 714/710
[58] Field of Search ................ 395/182.06, 182.03, 395/183.01, 182.04, 182.05, 185.05, 183.18, 185.07; 371/2.2, 10.2, 10.3, 21.1, 40.11, 40.2, 40.4, 40.12–40.14

[56] References Cited

U.S. PATENT DOCUMENTS

| | | | |
|---|---|---|---|
| 3,633,175 | 1/1972 | Harper | 711/108 |
| 4,426,688 | 1/1984 | Moxley | 365/200 |
| 4,608,687 | 8/1986 | Dutton | 371/10.1 |
| 5,199,033 | 3/1993 | McGooch et al. | 371/10.1 |
| 5,357,473 | 10/1994 | Mizuno et al. | 265/201 |
| 5,396,468 | 3/1995 | Harari et al. | 365/218 |
| 5,504,760 | 4/1996 | Harari et al. | 371/40.1 |
| 5,659,678 | 8/1997 | Aichelmann, Jr. et al. | 395/183.01 |
| 5,751,647 | 5/1998 | O'Toole | 365/200 |
| 5,758,056 | 5/1998 | Barr | 395/182.05 |

*Primary Examiner*—Dieu-Minh T. Le
*Attorney, Agent, or Firm*—Seed and Berry LLP

[57] ABSTRACT

A memory fault correction system enables data to be written to and read from memory devices having a relatively large number of defective storage locations. For each address of the memory device, there are a plurality of storage locations corresponding in number to the number of bits of data to be stored, a plurality of substitute storage locations in which data is stored instead of being stored at defective memory locations, and a plurality of identifying locations in which data is stored identifying the defective memory locations at each address. In a write operation to an address, the identifying locations at the address are read to identify the defective memory locations at that address. The data that would otherwise be written to the defective memory locations is then instead written to the substitute memory locations. The remaining data is written to the corresponding locations at the address. In a read operation from the address, the data stored in the corresponding memory locations, the data stored in the substitute memory locations, and the data stored in the identifying memory locations are read. The data read from the substitute memory locations are then substituted for the data read from the defective memory locations as determined by the data read from the identifying locations at the address.

20 Claims, 3 Drawing Sheets

Fig. 1

| 68:71 | 64:67 | 0:63 |
|---|---|---|
| REPLACEMENT CODE | REPLACEMENT DATA | DATA |
| REPLACEMENT CODE | REPLACEMENT DATA | DATA |

APPARATUS FOR ALLOWING DATA TRANSFERS WITH A MEMORY HAVING DEFECTIVE STORAGE LOCATIONS

TECHNICAL FIELD

The present invention relates to computer memory, and more particularly, to a system for allowing memory devices having defective memory locations to be used in high accuracy applications.

BACKGROUND OF THE INVENTION

Substantially all modern electronic computers rely on semiconductor memory to store data for processing by a central processing unit (CPU). Computers employing semiconductor memory vary from simple computers, such as those contained in telephone answering machines, to highly complex supercomputers employed for complicated scientific projects. In simple computers like those used for telephone answering machines, errors in one or more of the memory locations of the memory may not be fatal. For example, a mistake in the memory of the telephone answering machine likely would only cause the synthesized voice stored on the memory to be imperceptibly altered. However, one or more defective memory locations in a memory of a computer used to perform scientific calculations may cause substantial problems.

Although current manufacturing techniques have substantially reduced the number of defective memory locations, excessive numbers of defective memory locations are still sometimes produced during fabrication of computer memory. Those defective memory locations can be caused by any of numerous steps taken during manufacture of the memory chips, semiconductor crystallinity defects, electrical connector discontinuities, etc. Although memory chips with such defective memory locations typically represent a small portion (less than 1%) of the total number of memory chips produced, the actual number of such defective memory chips is substantial. In some cases, such defective memory chips can be sold at a greatly reduced price for applications that do not require perfect memory, such as for telephone answering machines. However, it would be beneficial if some of those memory chips could be employed in more critical applications, such as in personal computers.

Several prior art error handling schemes have been employed to compensate for defective memory locations. For example, one error handling scheme employs extra rows of memory cells, known as "redundant rows," that could be used to replace rows having defective memory cells. While the use of redundant rows is often successful in salvaging otherwise defective memory chips, the number of defective rows that can be replaced is limited to the number of redundant rows that are provided on the memory chip. The number of defective rows sometimes exceeds the number of redundant rows, thus preventing repair of some defective rows.

Other hardware techniques have also been proposed to compensate for defective locations in memory devices. Some of these techniques involve maintaining a record of defective memory locations and then redirecting accesses to these locations to memory locations that are known to be functioning properly. However, these solutions can require excessive hardware overhead, thus precluding these solutions from being cost effective.

Another prior art error handling scheme, known as error detection, detects when a single bit of a data word is in error. Error detection typically adds a single parity bit to each data word written to memory in order to make the sum of the data word and the parity be an even number. If the sum of the data word and the parity bit is an odd number when the data word is read, then the error detection scheme determines that one of the bits of the data word is in error. Such parity-based error detection often is inadequate because only single bit errors are detected, the particular bit in error is not identified, and the particular bit in error is not corrected.

Yet another error handling scheme, known as error correction, overcomes some of the deficiencies in prior art error detection schemes. Prior art correction schemes add to each data word an error correction code having plural error correction bits that enable the data word to be reconstituted in the event of an erroneous data bit within the data word. Commonly used error correcting codes are Hamming codes which append error detecting and correcting "syndrome bits" to a data word. The number of syndrome bits that are required depends upon the number of bits in the data word. For example, a 64-bit data word requires 8 syndrome bits to detect two error bits and correct one error bit. Additional error bits can be detected and corrected by using additional syndrome bits. However, the number of syndrome bits grows rapidly with increases in the number of erroneous bits. For example, 22 syndrome bits are required to correct 4 erroneous bits in a 64-bit word. In operation, the syndrome bits are stored in a memory along with the data word. The syndrome bits are read from the memory along with the data word, and the data word and syndrome bits are processed using a conventional algorithm to detect and then correct any error bits in the data word.

Although convention error correcting codes are adequate in some applications, they nevertheless exhibit serious limitations and disadvantages. For example, such prior art error correction schemes typically only reconstitute a data word if only a single bit of the data word is erroneous. Such single bit correction may be adequate when each data word includes only eight or sixteen data bits, but may be inadequate for the larger data words used in more advanced computer systems, such as computer systems based on Intel's Pentium Pro™ processor, which employ 64 bit data words. Such long data words have a much higher chance of having multiple data bits altered in error than eight or sixteen bit data words, and thus, single bit error detection may not provide the level of data protection desired by users of such advanced computer systems. This problem of multiple data bit errors is surprisingly common because defects in adjacent data bits in memory devices are quite common.

Another limitation of using conventional error correcting codes, such as Hamming codes, is that they can be used only for entire data words and thus cannot function for partial data words written to memory. Instead, error correcting codes can be used when writing partial words only by performing relatively complex and time consuming multiple memory accesses.

Still another disadvantage of memory correction techniques using conventional error correcting codes is the amount of memory that must be allocated to store the error correcting codes. This required memory, known as "memory overhead," reduces the capacity of memory devices thereby circumventing a major goal error correcting techniques, i.e., maximizing the storage capacity of memory devices containing defective memory locations. Also, a significant amount of logic circuitry is often required to generate the error codes during a memory write operation, and to decode the error codes during a memory read operation. This additional logic circuitry further increases the "hardware overhead" cost of this approach.

As a result of these limitations and disadvantages of using conventional error correcting codes, there is a need for a memory fault correction system that can correct partial data words read from defective memory locations, and that can correct a relatively large number of bits read from defective memory locations using relatively few error correcting bits thereby minimizing memory overhead.

SUMMARY OF THE INVENTION

In one preferred embodiment of the invention, a record of defective memory locations for each address of a memory device is maintained. When writing data to the memory device, the record of defective memory locations for a target address is checked to determine if there are any defective memory locations at that address. If not, the data is written in a normal manner to corresponding memory locations in a first set of memory locations at that address. If there is a defective memory location in the first set of memory locations at that address, the data that would be written to each defective memory location is instead written to respective substitute memory locations at that address. The remaining data is written to corresponding non-defective memory locations in the first set of memory locations at that address. The record of defective memory locations at each address may be stored in a separate storage device, or it may be stored in a second set of memory locations at each address in the memory device. After data has been written to the memory device, it may be read from the memory device despite the presence of defective memory locations. In a read operation, data is read from memory locations in the first set of memory locations at an address and from the substitute memory locations at the address. The data read from the substitute memory locations is then substituted for a portion of the data read from the memory locations in the first set as determined by the record of defective memory locations. As a result, bits of data read from the substitute memory locations are substituted for bits of data read from defective memory locations at the address.

Although a variety of circuits may be used, the data is preferably coupled from an external data bus to the memory device through data input path circuit and coupled from the memory device to the external data bus through a data output path circuit. In each circuit, a multiplexer is used to couple selected bits of the external data bus with either corresponding memory locations in the first set of memory locations for each address or substitute memory locations at that address. The multiplexers are controlled by respective decoders that decode the record of defective memory locations to couple selected bits of the external data bus to substitute memory locations instead of to defective memory locations in the first set of memory locations.

DETAILED DESCRIPTION OF THE INVENTION

Figure 1:
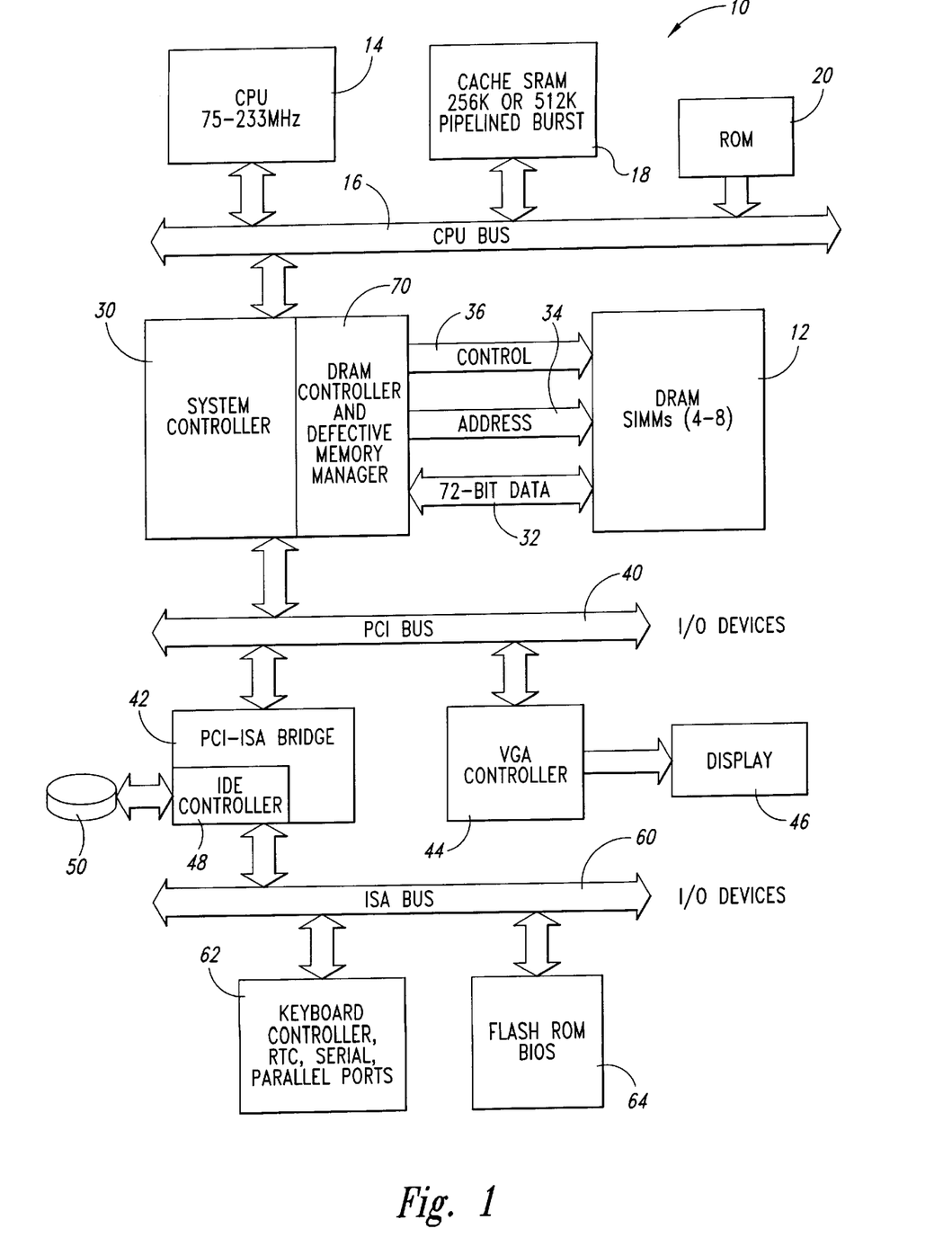
FIG. 1 is a block diagram of a computer system containing a memory device and a memory fault correction system for correcting data read from the memory device.

Illustrated in FIG. 1 is an embodiment of a computer system 10 in accordance with the invention for storing data in a dynamic random access memory ("DRAM") 12 or other memory device such as an extended data out ("EDO") DRAM, a synchronous DRAM ("SDRAM"), a video or graphics DRAM, a packetized DRAM, etc. The computer system 10 includes a CPU 14, such as an Intel® Pentium™ processor or Pentium Pro™ processor, although other CPU devices may, of course, be used. For example, the CPU may be any microprocessor, digital signal processor, micro controller, etc. The CPU 14 is coupled to a CPU bus 16 which includes data, control, and address buses (not shown) that provide a communication path between the CPU 14 and other devices, as explained below. The manner in which the CPU 14 communicates with these devices is conventional. One device with which the CPU 14 communicates is a cache memory device, typically cache static random access memory ("SRAM") 18, which is also coupled to the CPU bus 16. As is well known in the art, the cache SRAM 18 is generally used for the high speed storage of instructions that are frequently executed by the CPU 14, as well as for data that are frequently used by the CPU 14. Also coupled to the CPU 14 through the CPU bus 16 is a read only memory ("ROM") 20 which stores data in a non-volatile manner for access by the CPU 14. The ROM 20 may also permanently store instructions executed by the CPU 14 for causing it to function as explained herein.

Also coupled to the CPU bus 16 is a system controller 30. The system controller 30 performs three basic functions, the first two of which are common to conventional system controllers (not shown) used in conventional computer systems (not shown). First, the system controller 30 includes a DRAM controller (not shown) which interfaces the CPU 14 with the DRAM 12 to allow the CPU to write data to and read data from the DRAM 12. Basically, the system controller 30 performs this function by receiving and sending data to the CPU 14 (although the data may bypass the system controller 30 by being coupled directly to the CPU bus 16), receives addresses from the CPU 14, and receives high level command and control signals from the CPU 14. In response, the system controller 30 couples the data to and from the DRAM 12 via a data bus 32, generates separate row and column addresses and sequentially applies them to the DRAM 12 via an internal address bus 34, and generates and applies to the DRAM 12 lower level command signals via a control bus 36. In the preferred embodiment, the data bus 32 has a width or capacity of 72 bits, although the data bus 32 could alternatively have a capacity of virtually any number of bits. As explained below, in one embodiment, the 72 bits transferred to and from the DRAM 12 via the data bus 32 include 64 data bits and 8 error correcting bits, although other combinations may also be used. Under these circumstances, the data bus portion of the CPU bus 16 has a 64-bit capacity, although it may have both larger and smaller capacities.

The second conventional function performed by the system controller 30 is to interface the CPU bus 16 to a peripheral I/O bus, such as a Peripheral Component Interconnect ("PCI") bus 40. The PCI bus 40, in turn, is coupled to a conventional PCI-ISA bus bridge 42 and a conventional VGA controller 44 driving a conventional display 46. The PCI bus 40 may also be connected to other peripheral devices (not shown) in a manner well known to one skilled in the art. The PCI-ISA bus bridge 42 may also include a disk drive controller, such as an Integrated Device Electronics ("IDE") controller 48, which controls the operation of an IDE disk drive 50 in a conventional manner.

The PCI bus 40 is a relatively high speed peripheral I/O bus. Many peripheral devices currently in use are adapted to interface with a relatively slow speed peripheral I/O bus known as an industry standard architecture ("ISA") bus. The computer system 10 illustrated in FIG. 1 includes an ISA bus 60 that may be coupled to a Keyboard Controller, Real Time Clock, and Serial and Parallel Ports, all of which are collectively designated by reference number 62. The ISA bus 60 may also be coupled to a Flash ROM BIOS 64 as well as other I/O devices (not shown) as is well known in the art.

The function that the system controller 30 performs that is different from the functions performed by prior art system controllers (not shown) is accomplished with a Defective Memory Manager 70. Although the Defective Memory Manager 70 may be part of the system controller 30, it will be understood that it may be possible for it to be a stand-alone device that is separate from the system controller 30. In interfacing the CPU 14 with the DRAM 12, the Defective Memory Manager 70 also compensates for faulty memory locations in the DRAM 12 at addresses where the CPU 14 or other memory access device, such as a PCI device, (not shown) is attempting to read or write data. The manner in which this function is performed is explained with reference to the data structure diagram of FIG. 2 which shows the structure of data that may be stored in a computer storage media, such as the DRAM 12. The first 64 bits on the data bus 32 are data bits that, except as noted below, are identical to the 64 bits of data on the data bus portion of the CPU bus 16. The exception is that up to 4 bits in a single nibble (i.e., groups of 4 consecutive bits) of these 64 bits may be bits that the CPU 14 is attempting to write to bad memory locations in the DRAM 12, or the CPU 14 is reading from bad memory locations in the DRAM 12. For example, 64 bits of data applied to the data bus portion of the processor bus 16 by the CPU 14 will be written to 64 locations at an address in the DRAM 12 determined by an address which the CPU 14 applies to an address bus portion of the processor bus 16. If the $5^{th}$, $6^{th}$, and $7^{th}$ memory locations at that address are faulty, then the three bits of data read from these locations would be in error. Thus, under these circumstances, data bits D7, D6 and D5 (which are all in the second nibble) would be in error. To compensate for errors in data read from faulty memory locations, 8 additional bits are written to and read from the DRAM 12 via the data bus 32. Four of these bits 71:68 constitute a Replacement Code that specifies the nibble (1 of 16) that would be written to are read from one or more faulty locations in the DRAM 12. Up to 4 memory locations can be faulty, as long as the data to be stored in the faulty locations are all grouped into the same nibble. DRAM 12 having defective memory locations can be sorted so that none of the DRAM 12 have defective memory locations in more than one nibble. Thus, using the above example where the $5^{th}$, $6^{th}$, and $7^{th}$ memory locations are faulty, bits 71:68 would be "0010" to specify the second nibble as containing at least one bit of data that is to be read from or written to a faulty memory location in the DRAM 12.

Figure 2:
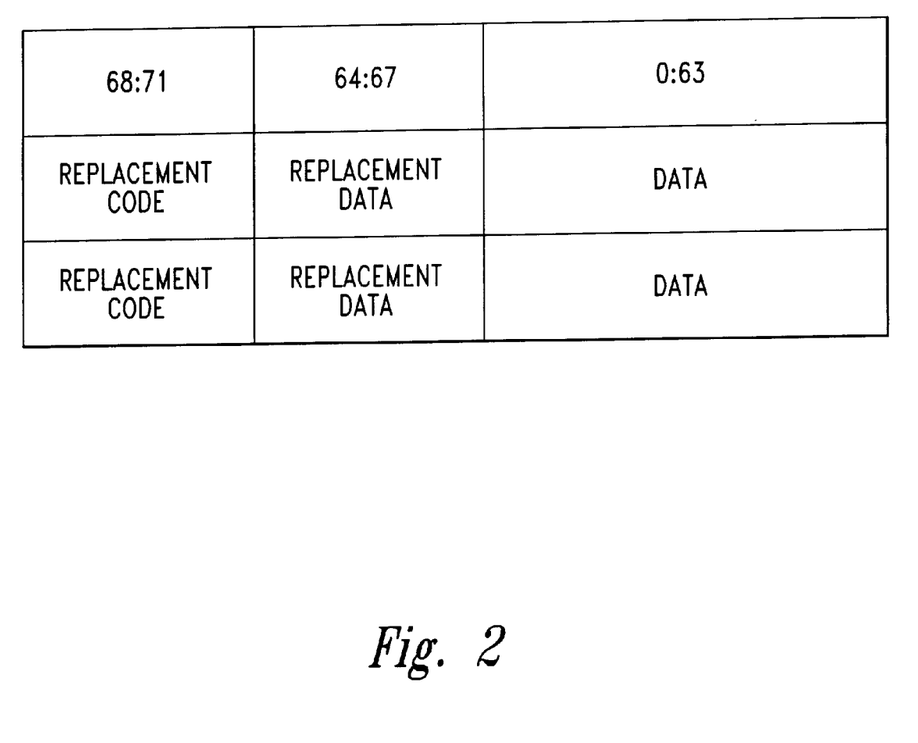
FIG. 2 is a data structure diagram showing the characteristics of a two-part, 8-bit error correcting code used with a 64-bit data word.

The remaining 4 bits, D67:64, constitute a replacement nibble that replaces the nibble that contains data that is to be read from or written to a faulty memory location in the DRAM 12. For a memory write operation, the bits D67:64 will be identical to the data in the nibble that is to be written to a faulty memory location. However, as explained in detail below, the bits D67:64 will be properly stored in the DRAM 12, while at least some of the data in the corresponding nibble in bits D63:D0 will not be properly stored in the DRAM 12. For a memory read operation, the bits D67:64 on the data bus 32 will be the correct data as properly stored in the DRAM 12, while at least some of the bits in the corresponding nibble in bits D63:D0 will be corrupted because the bits were not properly stored in the DRAM 12. As explained in detail below, during a memory read operation, the Defective Memory Manager 70 substitutes the replacement data D71:D68 for the defective nibble in the proper location of bits D63:D0 as specified by the Replacement Code. In the above-example, the Defective Memory Manager 70 receives the 72 bits from the DRAM 12 via the data bus 32, determines from the Replacement Code that the second nibble of data (i.e., D7:D4) received from the DRAM 12 is defective, substitutes bits D67:D64 for bits D7:D4, and applies the corrected 64 bits of data to the data bus portion of the CPU bus 16.

Although one embodiment of the Defective Memory Manager 70 groups the data into nibbles, it will be understood that the data can be grouped into sub-words containing different numbers of bits. For example, the 64-bit word of data can be grouped into 32 sub-words each containing 2 bits. The 32 sub-words could be designated by a 5-bit Replacement Code, and there would be 2 bits of Replacement Data. Using this example, the data bus 32 would require a capacity of 71 bits (64+5+2).

Figure 3:
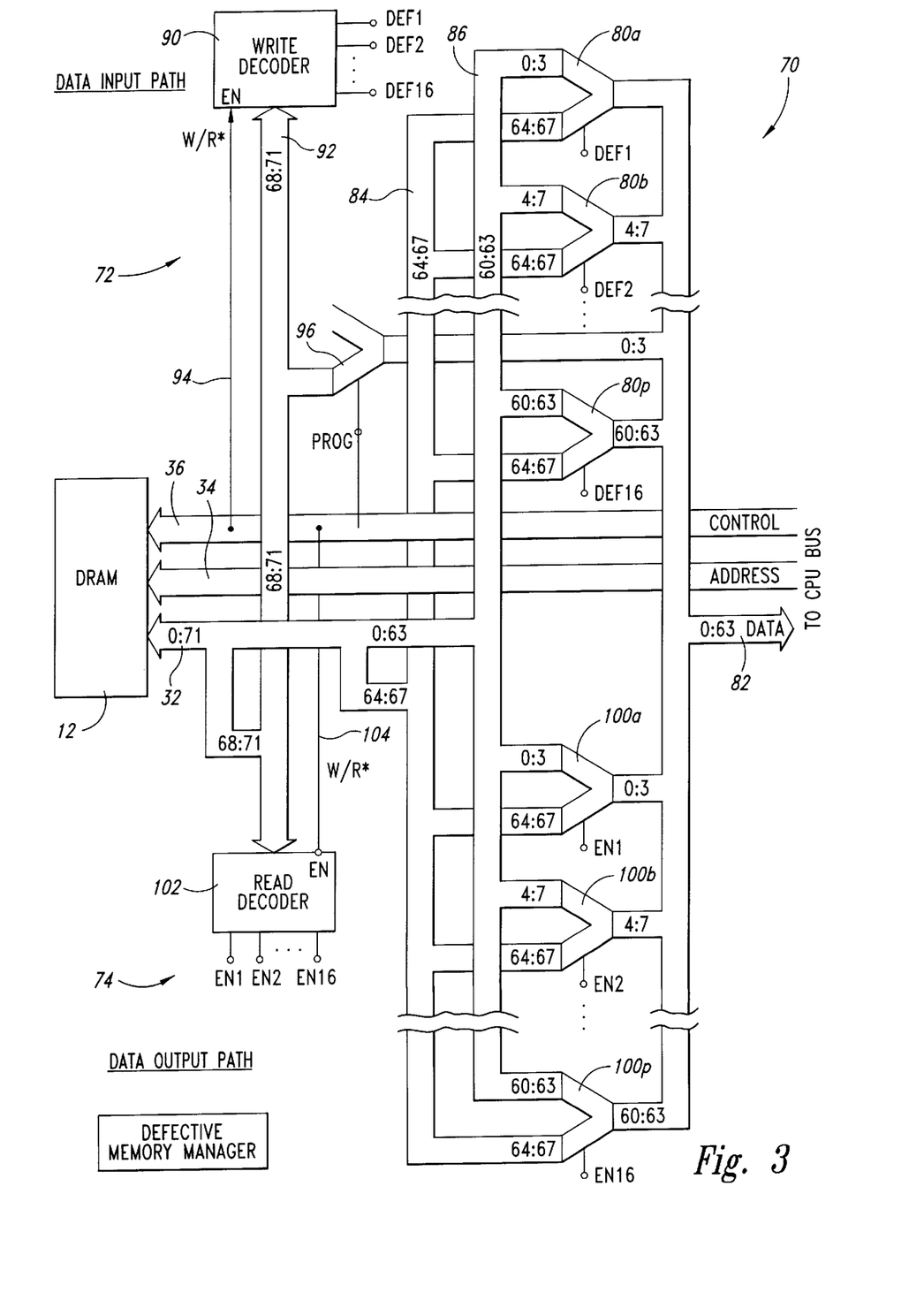
FIG. 3 is a block diagram of a memory fault correction system used in the computer system of FIG. 1.

One embodiment of a Defective Memory Manager 70 is illustrated in FIG. 3. This Defective Memory Manager 70 is divided into a Data Input Path circuit 72 for coupling data to the DRAM during a memory write operation, and a Data Output Path circuit 74 for coupling data from the DRAM during a memory read operation. The Date Input Path circuit 72 includes 16 multiplexers 80a–80p which couple 4 respective bits of a 64-bit external data bus 82 to either a Replacement Data Bus 84 consisting of bits D67:D64 or to 4 corresponding bits of an internal data bus 86 connected to the data bus 32. Thus, for example, the multiplexer 80b couples bits D7:D4 of the external data bus 82 to either the Replacement Data Bus 84 or bits D7:D4 of the data bus 32. The multiplexers 80a–80p normally couple 4 respective bits of the external data bus 82 to 4 corresponding bits of the internal data bus 86 except when one of the multiplexers is switched.

The multiplexers 80a–80p are controlled by a write decoder 90 that decodes the 4 bits of a Replacement Code on a Replacement Code bus 92, and generates a corresponding output responsive to an active high W/R* signal applied to its enable input. The W/R* signal is coupled through a line 94 from the control bus 36 to the DRAM 12. In the event the W/R* signal is not present on the control bus 94, another signal or combination of signals will be present to specify to DRAM 12 whether a memory transfer operation is either a write or a read operation. The write decoder 90 operates in a conventional manner to generate an active output on one of 19 DEF outputs, DEF1–DEF16, to cause its corresponding multiplexer 80a–p to couple 4 respective bits of the external data bus 82 to the Replacement Data Bus 84 rather than to the internal data bus 86. All other multiplexers continue to couple 4 respective bits of the external data bus 82 to the internal data bus 86. Note that while the write decoder will decode Replacement Codes on the Replacement Bus 92 during a read operation, it will not generate any output signals DEF1–DEF16 until the W/R* signal transitions active high during a write operation.

Using the above example where the $5^{th}$, $6^{th}$, and $7^{th}$ locations of the DRAM 12 at an address are faulty, the Replacement Code on the Replacement Code bus 92 would be 0010 as explained above, which would be decoded by the Write Decoder 90 to generate a DEF2 output. The DEF2 signal would then switch the multiplexer 80b so that it coupled bits D7:D4 of the external data bus 82 to bits D67:64 of the data bus 32. As a result, instead of data bits D7:D4 attempting to be stored at the 5$^{th}$ through 8$^{th}$ defective memory locations of the address, they are instead stored at the 65$^{th}$ through 68$^{th}$ memory locations, i.e., D67:D64.

The Data Input Path circuit 72 also includes a program multiplexer 96 which couples the first 4 bits of the external data bus 82 to the Replacement Code Bus 92 responsive to a PROG signal. As explained below, the program multiplexer 96 is used to store Replacement Codes in the DRAM 12 after defective locations have been identified during a conventional memory test of the type normally performed at power-up. Instead of testing the DRAM 12 to identify faulty memory locations during each power-up, a record of defective memory locations may be stored in non-volatile memory (not shown).

The Data Output Path circuit 74 contains essentially the same components as used in the Data Input Path circuit 72 except they are connected in a different manner. The Data Output Path circuit 74 includes 16 multiplexers 100a–100p which couple either the Replacement Data Bus 84 or 4 corresponding bits of the internal data bus 86 to 4 respective bits of the external data bus 82. Thus, for example, the multiplexer 100b couples either the Replacement Data Bus 84 or bits D7:D4 of the data bus 32 to bits D7:D4 of the external data bus 82. The multiplexers 100a–100p normally couple 4 respective bits of the internal data bus 86 to 4 corresponding bits of the external data bus 82 except when one of the multiplexers is switched.

The multiplexers 100a–100p are controlled by a read decoder 102 that decodes the 4 bits of a Replacement Code on the Replacement Code bus 92, and generates a corresponding output responsive to an active low W/R* signal applied to its enable input. The W/R* signal is coupled through a line 102 from the same line(s) of the control bus 36 that is used to obtain the W/R* signal applied to the write decoder 90. The read decoder 102 operates in the same manner as the write decoder 90 to generate an active output on one of 19 EN outputs, EN1–EN16, to cause its corresponding multiplexer 100a–p to couple the external data bus 82 to 4 respective bits of the Replacement Data Bus 84 rather than to 4 respective bits of the internal data bus 86. All other multiplexers 100 a–p continue to couple 4 respective bits the internal data bus 86 to 4 corresponding bits of the external data bus 82.

Using the above example where the 5$^{th}$, 6$^{th}$, and 7$^{th}$ locations of the DRAM 12 at an address are faulty, the Replacement Code on the Replacement Code bus 92 would be "0010" as explained above, which would be decoded by the Read Decoder 102 to generate an EN2 output. The EN2 signal would then switch the multiplexer 100b so that it coupled bits D67:64 of the data bus 32 to bits D7:D4 of the external data bus 82. Thus, the Replacement Data, which is the correct version of the data written to the 5$^{th}$–8$^{th}$ memory locations, is substituted for the second nibble stored in the DRAM 12 containing defective data bits D6:D4.

In operation, the CPU 14 tests the memory locations of the DRAM 12 in a conventional manner, and stores the identity of defective memory locations in a register or other suitable temporary storage. Alternatively, a record of defective memory locations may be stored in non-volatile memory such as the ROM 20, and the CPU 14 can obtain the data identifying the defective memory locations from there. The CPU 14 then outputs a control signal to the System Controller 30 which causes the System Controller 30 to apply a PROG signal to the multiplexer 96. The multiplexer then couples bits 0:3 of the data bus portion of the CPU bus 16 to bits 68:71 on the data bus 32 of the DRAM 12. The CPU then writes a 4-bit word identifying the defective nibble at each memory address containing a defective nibble. For example, if bits 57:59 at address 1000 are defective, then binary "1110" (decimal "14") will be written to bits 68:71 at address 1000 to identify the 14$^{th}$ nibble as being defective. If bits 55:57 were defective, the defective bits will be in two different nibbles, and the preferred embodiment of the invention shown in FIG. 3 would thus not allow memory location to be used. However, memory location 1000 could be used by substituting redundant memory locations in a conventional manner. Also, it will be apparent to one skilled in the art that the embodiment of FIG. 3 could be easily adapted to handle multiple defective nibbles or defective nibbles not starting at bits 4N, where N is an integer that is equal or greater to zero.

After data identifying all of the defective nibbles have been written into bits 68:71 of the DRAM 12 at each address containing a defective memory location, the CPU 14 switches the PROG signal to return the multiplexer 96 to its normal state. In this condition, the multiplexer 96 couples bits 0:3 of the data bus portion of the CPU bus 16 to corresponding bits 0:3 on the data bus 32 of the DRAM 12.

In the event of a write operation, bits 68:71 of the DRAM 12 must first be read to determine if the address to which the write is to occur contains defective memory locations. It will be recalled that data has been stored in bits 68:71 identifying any defective nibble at that address. Thus, prior to a write to a given address of the DRAM 12, bits 68:71 of the DRAM 12 are read and applied to a write decoder 90. If a nibble in the target address does contain one or more defective memory bits, the identify of the defective nibble will be decoded by the write decoder 90 during the next bus cycle when an active high write W/R* signal is applied to the enable input EN of the write decoder 90. The write decoder 90 will then cause a corresponding defect signal DEF$_1$, DEF$_2$ . . . DEF$_{16}$ to be active. The active defect signal will switch its corresponding multiplexer 80a, 80b . . . 80p so that the bits of the data bus 82 corresponding to the defective nibble are coupled to bits 67:64 of the data bus 32 of the DRAM 12. The data bits that would be written into a defective nibble in the DRAM 12 are then instead written into bits 67:64 of the DRAM 12. For example, if bits 10:8 of memory location 500 are defective, bits 71:68 will be read as "0010" (decimal 2) during the previous read operation to identify the second nibble, i.e., bits 11:8 (note that bits 0:3 are the 0$^{th}$ nibble). As a result, the multiplexer 80c will couple bits 10:8 of the data bus 82 to bits 67:64 of the data bus 32, and bits 67:64 on the data bus 32 are then written into bits 67:64 of the DRAM 12 at the selected address. Thus, the data that would be written into a defective nibble of the DRAM 12 are instead written into bits 67:64 of the DRAM 12 so that this data can be read during a subsequent read operation, as explained below.

In the event of a read from a given address of the DRAM 12, bits 71:68 of the address are applied to a read decoder 102. It will be recalled that data has been stored in bits 71:68 identifying any defective nibble at that address. Thus, if a nibble does contain one or more defective memory bits, the identify of the defective nibble 102 will be decoded by the read decoder 102. The read decoder 102 will then cause a corresponding enable signal EN$_1$, EN$_2$ . . . EN$_{16}$ to be active. The active enable signal will switch its corresponding multiplexer 100a, 100b . . . 100p so that bits 67:64 of the data bus 32 of the DRAM 12 are coupled to the bits of the data bus 82 corresponding to the defective nibble. At the same time, the bits of the data bus 32 corresponding to the defective nibble are decoupled from their corresponding bits of the data bus 82. It will be recalled that the data bits corresponding to a defective nibble are written into the DRAM 12 at bits 67:64. Thus, the correct data read from bits 67:64 are substituted for defective data from a defective nibble of memory. For example, if bits 10:8 of memory location 500 are defective, bits 71:68 will be "0010" (decimal 2) to identify the second nibble, i.e., bits 11:8 (note that bits 0:3 are the 0th nibble). As a result, the multiplexer 100c will decouple defective bits 10:8 of the data bus 32 bits from bits 11:8 of the data bus 82, and it will couple bits 67:64 of the data bus 32 to bits 11:8 of the data bus 82. As a result, all 64 bits of data applied to the data bus 82 will contain the correct data even though data has been read from an address containing as many as 4 defective memory locations.

It will be understood that various modifications are possible while still allowing the embodiment shown in FIG. 3 to operate in substantially the same manner. For example, rather than storing the identify of the defective nibble and/or the substitute data in the same DRAM 12 as the remainder of the data, the identify of the defective nibble and/or the substitute data may be stored in a different DRAM or other storage device (not shown). Similarly, selection devices other than the multiplexers 80, 100 may be used, and they may be enabled by devices other than the decoders 90, 102, respectively. Thus, from the foregoing it will be appreciated that, although specific embodiments of the invention have been described herein for the purposes illustration, various modifications may be made without departing from the spirit and scope of the invention. Accordingly, the invention is not to be limited except as by the appended claims.

I claim:

1. In a computer storage medium containing data stored in a data structure for use by a computer, the data structure comprising:
    a first set of storage locations at each address of the computer storage medium in which one or more of the storage locations may be defective, the storage locations in the first set having received respective bits of data and stored at least some of the bits of data in respective, non-defective storage locations;
    a second set of storage locations at each address, the storage locations in the second set containing a record of defective storage locations in the first set at the corresponding address in the storage medium; and
    a set of substitute storage locations at each address, the number of storage locations in the set of substitute storage locations being less than the number of storage locations in the first set at the corresponding address, the substitute storage locations storing the respective bits of data received by any defective storage locations in the first set of storage locations at the corresponding address in the storage medium.

2. The data structure of claim 1 wherein the record of defective storage locations at each address in the storage medium is stored at a second set of storage locations at the address, the storage locations in the second set being different from the storage locations in the first set of storage locations and the substitute storage locations.

3. The data structure of claim 2 wherein the storage medium includes at each address 64 storage locations in the first set of storage locations, 4 substitute storage locations adapted to substitute for 4 storage locations in the first set of storage locations, and 4 storage locations in the second set of storage locations adapted to identify each of 16 sets of 4 contiguous storage locations in the first set for which the substitute storage locations are to be used.

4. The data structure of claim 1 wherein the storage medium comprises a dynamic random access memory.

5. A memory correction system for allowing data to be written to and read from a memory device having a plurality of memory locations at each of a plurality of addresses in which one or more memory locations at each address may be defective, the memory locations at each address being divided into a first set of memory locations corresponding in number to at least the number of bits in the data to be stored in the memory device, and a second set of memory locations adapted to substitute for defective memory locations in the first set, the memory device further including a data bus having a plurality of bits coupled to respective memory locations of the memory device at each address; the memory correction system comprising:
    a storage device containing defect data identifying any defective storage locations in the first set of memory locations in the memory device for each address in the memory device;
    a data input path circuit coupling an external data bus to the data bus of the memory device, the data input path circuit comprising:
        a write multiplexer coupling each bit of the external data bus to a respective memory location in the first set of memory locations at each address when a first enable signal for the memory location is inactive, and coupling a bit of the external data bus to a respective memory location in the second set of memory locations at each address when a first enable signal for the memory location is active; and
        a write decoder coupled to the write multiplexer and to the storage device, the write decoder decoding the defect data to generate and apply an active first enable signal to the write multiplexer for each memory location in the first set that is identified by the defect data as being defective and to generate and apply an inactive first enable signal to the write multiplexer for each remaining memory location in the first set; and
    a data output path circuit coupling the data bus of the memory device to the external data bus, the data output path circuit comprising:
        a read multiplexer coupling each memory location in the first set of memory locations at each address to a respective bit of the external data bus when a second enable signal for the memory location is inactive, and coupling a memory location in the second set of memory locations at each address to a bit of the external data bus when a second enable signal for the memory location is active; and
        a read decoder coupled to the read multiplexer and to the storage device, the read decoder decoding the defect data to generate and apply an active second enable signal to the read multiplexer for each memory location in the first set that is identified by the defect data as being defective and to generate and apply an inactive second enable signal to the read multiplexer for each remaining memory location in the first set.

6. The memory correction system of claim 5 wherein the storage device comprises a third set of memory locations at each address of the memory device, the third set of memory locations storing at each address the defect data identifying any defective storage locations in the first set of memory locations in the memory device at that address.

7. The memory correction system of claim 6 wherein the memory device includes at each address 64 memory locations in the first set of memory locations, 4 substitute memory locations in the second set adapted to substitute for 4 memory locations in the first set of memory locations, and 4 memory locations in the third set of memory locations adapted to identify each of 16 sets of 4 contiguous memory locations in the first set for which the substitute memory locations in the second set are to be used.

8. The memory correction system of claim 5 wherein the memory device comprises a dynamic random access memory.

9. The memory correction system of claim 5 wherein the memory device includes at each address 64 memory locations in the first set of memory locations, and 4 substitute memory locations in the second set adapted to substitute for 4 memory locations in the first set of memory locations.

10. The memory correction system of claim 5 wherein the storage device comprises a non-volatile memory containing the defect data.

11. The memory correction system of claim 10 wherein the non-volatile memory comprises a read only memory.

12. A computer system, comprising:
an input device adapted to receive information from a user;
an output device adapted to provide information to a user;
a processor coupled to the input device and the output device, the processor being structured to process data according to programmed instructions;
a memory device having a plurality of memory locations at each of a plurality of addresses, the memory locations at each address being divided into a first set of memory locations corresponding in number to at least the number of bits in the data to be stored in the memory device, and a second set of memory locations adapted to substitute for defective memory locations in the first set, the memory device further including a data bus having a plurality of bits coupled to respective memory locations of the memory device at each address;
a memory controller coupling the data bus of the memory device to the processor, the memory device including a memory correction system for allowing data to be written to and read from the memory device even though one or more memory locations in the first set of memory addresses at each address may be defective, the memory correction system comprising:
a storage device containing defect data identifying any defective storage locations in the first set of memory locations in the memory device for each address in the memory device;
a data input path circuit coupling an external data bus to the data bus of the memory device, the data input path circuit comprising:
a write multiplexer coupling each bit of the external data bus to a respective memory location in the first set of memory locations at each address when a first enable signal for the memory location is inactive, and coupling a bit of the external data bus to a respective memory location in the second set of memory locations at each address when a first enable signal for the memory location is active; and
a write decoder coupled to the write multiplexer and to the storage device, the write decoder decoding the defect data to generate and apply an active first enable signal to the write multiplexer for each memory location in the first set that is identified by the defect data as being defective and to generate and apply an inactive first enable signal to the write multiplexer for each remaining memory location in the first set; and
a data output path circuit coupling the data bus of the memory device to the external data bus, the data output path circuit comprising:
a read multiplexer coupling each memory location in the first set of memory locations at each address to a respective bit of the external data bus when a second enable signal for the memory location is inactive, and coupling a memory location in the second set of memory locations at each address to a bit of the external data bus when a second enable signal for the memory location is active; and
a read decoder coupled to the read multiplexer and to the storage device, the read decoder decoding the defect data to generate and apply an active second enable signal to the read multiplexer for each memory location in the first set that is identified by the defect data as being defective and to generate and apply an inactive second enable signal to the read multiplexer for each remaining memory location in the first set.

13. The computer system of claim 12 wherein the storage device comprises a third set of memory locations at each address of the memory device, the third set of memory locations storing at each address the defect data identifying any defective storage locations in the first set of memory locations in the memory device at that address.

14. The computer system of claim 13 wherein the memory device includes at each address 64 memory locations in the first set of memory locations, 4 substitute memory locations in the second set adapted to substitute for 4 memory locations in the first set of memory locations, and 4 memory locations in the third set of memory locations adapted to identify each of 16 sets of 4 contiguous memory locations in the first set for which the substitute memory locations in the second set are to be used.

15. The computer system of claim 12 wherein the storage device comprises a non-volatile memory containing the defect data.

16. The computer system of claim 15 wherein the non-volatile memory comprises a read only memory.

17. The computer system of claim 12 wherein the memory device comprises a dynamic random access memory.

18. The computer system of claim 12 wherein the memory device includes at each address 64 memory locations in the first set of memory locations, and 4 substitute memory locations in the second set adapted to substitute for 4 memory locations in the first set of memory locations.

19. A program storage device storing instructions that, when executed by a processor, perform a plurality of steps in connection with a memory, the steps comprising:
maintaining a record of defective memory locations at each address of the memory;
in response to receiving a first address directed to the memory, checking the record of defective memory locations to determine if there are any defective memory locations at the first address in the memory;
if there are no defective memory locations at the first address, writing the data to corresponding memory locations in a first set of memory locations at the first address; and if there is at least one defective memory location at the first address, writing a subset of the data to respective substitute memory locations at the first address, the subset of data including the data that would be written to each defective memory location in the first set of memory locations at the first address, and writing the data not in the subset to corresponding memory locations in the first set of memory locations at the first address.

20. The program storage device of claim 19 wherein the stored instructions further cause the processor to perform the step of storing the record of defective memory locations at each address in the memory at a second set of memory locations at the address, the memory locations in the second set being different from the memory locations in the first set of memory locations and the substitute memory locations.

* * * * *